United States Patent
Greenspan et al.

(10) Patent No.: US 11,907,463 B2
(45) Date of Patent: Feb. 20, 2024

(54) PRESSURE-SENSITIVE MACHINE INTERFACE DEVICE

(71) Applicant: Accenture Global Solutions Limited, Dublin (IE)

(72) Inventors: Mark Benjamin Greenspan, San Francisco, CA (US); Lavinia Andreea Danielescu, San Francisco, CA (US)

(73) Assignee: Accenture Global Solutions Limited, Dublin (IE)

(*) Notice: Subject to any disclaimer, the term of this patent is extended or adjusted under 35 U.S.C. 154(b) by 0 days.

(21) Appl. No.: 17/211,267

(22) Filed: Mar. 24, 2021

(65) Prior Publication Data

US 2021/0349596 A1 Nov. 11, 2021

Related U.S. Application Data

(60) Provisional application No. 63/022,135, filed on May 8, 2020.

(51) Int. Cl.
*G06F 3/041* (2006.01)
*H05K 3/10* (2006.01)

(52) U.S. Cl.
CPC ........ *G06F 3/04144* (2019.05); *G06F 3/0416* (2013.01); *G06F 3/04142* (2019.05); *H05K 3/10* (2013.01); *G06F 2203/04103* (2013.01)

(58) Field of Classification Search
None
See application file for complete search history.

(56) References Cited

U.S. PATENT DOCUMENTS

| | | | | |
|---|---|---|---|---|
| 4,017,697 A * | 4/1977 | Larson | ................ | H01H 13/702 200/512 |
| 8,054,294 B2 * | 11/2011 | Sakai | ............... | H04N 21/42204 345/169 |
| 8,473,865 B2 * | 6/2013 | Huang | .................... | G06F 9/445 715/810 |
| 8,698,759 B2 * | 4/2014 | Shin | .................... | G06F 3/04883 345/173 |

(Continued)

FOREIGN PATENT DOCUMENTS

WO WO 2019/136143 7/2019

OTHER PUBLICATIONS

Crestoron TSW-1060-B-S Feb. 20, 2019 https://www.crestron.com/en-US/Products/Control-Surfaces/Touch-Screens/ Large-Touch-Screens/TSW-1060-B-S (Year: 2019).*

(Continued)

*Primary Examiner* — Matthew Yeung
(74) *Attorney, Agent, or Firm* — Fish & Richardson P.C.

(57) ABSTRACT

This document described pressure-sensitive human machine interface (HMI) devices. In some aspects, a pressure-sensitive human-machine interface (HMI) device may include a surface element comprising an outer surface for receiving pressure inputs. The HMI device may also include multiple pressure-sensitive input regions that each include one or more positive electrodes and one or more return electrodes. The HMI device may also include a pressure-sensitive conductive sheet disposed adjacent to or between the one or more positive electrodes and one or more return electrodes of the multiple pressure-sensitive input regions.

16 Claims, 5 Drawing Sheets

(56) References Cited

U.S. PATENT DOCUMENTS

| | | | | |
|---|---|---|---|---|
| 2008/0165141 | A1* | 7/2008 | Christie | G06F 3/0482 |
| | | | | 345/173 |
| 2008/0252616 | A1* | 10/2008 | Chen | G06F 3/0421 |
| | | | | 345/173 |
| 2011/0022991 | A1* | 1/2011 | Hillis | G06F 3/04883 |
| | | | | 345/173 |
| 2013/0083496 | A1* | 4/2013 | Franklin | H04M 1/0268 |
| | | | | 361/752 |
| 2014/0267128 | A1* | 9/2014 | Bulea | G06F 3/0445 |
| | | | | 345/174 |
| 2015/0160779 | A1* | 6/2015 | Huang | G06F 3/0488 |
| | | | | 345/173 |
| 2016/0195931 | A1* | 7/2016 | Czelnik | G06F 3/016 |
| | | | | 345/173 |
| 2016/0195955 | A1 | 7/2016 | Picciotto et al. | |
| 2016/0328065 | A1* | 11/2016 | Johnson | G06F 3/044 |
| 2017/0068401 | A1* | 3/2017 | Joo | G06F 3/0481 |
| 2017/0102823 | A1* | 4/2017 | Moon | G06F 3/0412 |
| 2017/0115804 | A1* | 4/2017 | Oikubo | H01L 27/323 |
| 2017/0261386 | A1* | 9/2017 | Keyes | F41J 5/048 |
| 2017/0315658 | A1* | 11/2017 | Vandermeijden | G06F 3/0447 |
| 2017/0344165 | A1* | 11/2017 | Heo | H10K 77/111 |
| 2017/0371470 | A1* | 12/2017 | Nathan | G06F 3/0445 |
| 2019/0073079 | A1* | 3/2019 | Xu | G06F 3/0416 |
| 2019/0137322 | A1* | 5/2019 | Choi | G01L 9/08 |
| 2022/0100276 | A1* | 3/2022 | Vanhelle | G06F 3/0416 |

OTHER PUBLICATIONS

Cass, "5 Ways to Hide or Decorate Around the TV, Electronics, and Cords" Jun. 29, 2015, https://www.remodelaholic.com/ways-to-hide-decorate-around-tv-electronics-cords/4/ hereinafter "Cass") (Year: 2015).*

3M, "Product Data Sheet: 3M™ Conductive Film Products," dated 2014, 3 pages.

Adafruit.com [online], "Firewalker LED Sneakers: Make Velostat Step Sensors," available on or before Sep. 2, 2013, via Internet Archive: Wayback Machine URL<https://web.archive.org/web/20130902032148/https://learn.adafruit.com/firewalker-led-sneakers/make-velostat-step-sensors>, retrieved on Jan. 3, 2022, retrieved from URL<https://learn.adafruit.com/firewalker-led-sneakers/make-velostat-step-sensors>, 16 pages.

Adafruit.com [online], "Firewalker LED Sneakers: Overview," available on or before Sep. 2, 2013, via Internet Archive: Wayback Machine URL<https://web.archive.org/web/20130902014917/https://learn.adafruit.com/firewalker-led-sneakers>, retrieved on Jan. 3, 2022, retrieved from URL<https://learn.adafruit.com/firewalker-led-sneakers>, 18 pages.

Adafruit.com [online], "Pressure-Sensitive Conductive Sheet (Velostat/Linqstat)," available on or before Jul. 7, 2013, via Internet Archive: Wayback Machine URL<https://web.archive.org/web/20130707074043/https://www.adafruit.com/product/1361>, retrieved on Jan. 3, 2022, retrieved from URL<https://www.adafruit.com/product/1361>, 7 pages.

Arion.run [online], "Arion wearable," available on or before Aug. 5, 2020, via Internet Archive: Wayback Machine URL<https://web.archive.org/web/20200805223715/https://www.arion.run/wearable/>, retrieved on Oct. 8, 2021, retrieved from URL<https://www.arion.run/wearable/>, 11 pages.

EP Extended Search Report in European Appln. No. 21164925.6, dated Sep. 15, 2021, 12 pages.

GetCarv.com [online], "CARV: How it Works," available on or before Oct. 22, 2020, via Internet Archive: Wayback Machine URL<https://web.archive.org/web/20201022004905/https://getcarv.com/how-it-works>, retrieved on Jan. 3, 2022, retrieved from URL<https://getcarv.com/how-it-works>, 16 pages.

Kobakant.at [online], "Conductive Materials: Velostat," available on or before Jun. 5, 2011, via Internet Archive: Wayback Machine URL<https://web.archive.org/web/20110605153425/https://www.kobakant.at/DIY/?p=381>, retrieved on Jan. 3, 2022, retrieved from URL<https://www.kobakant.at/DIY/?p=381>, 7 pages.

Li et al., "Development of an Inexpensive Tri-axial Force Sensor for Minimally Invasive Surgery," 2017 IEEE/RSJ International Conference on Intelligent Robots and Systems, Vancouver, BC, Canada, Sep. 24-28, 2017, 906-913.

Perner-Wilson, "Handcrafting Textile Sensors from Scratch," available on or before Mar. 3, 2019, via Internet Archive: Wayback Machine URL<https://web.archive.org/web/20190303160754if_/https://cdn-shop.adafruit.com/datasheets/HandcraftingSensors.pdf, retrieved on Mar. 31, 2020, 50 pages.

SensoriaFitness.com [online], "Sensoria Artificial Intelligence Sportswear," available on or before Jun. 27, 2013, via Internet Archive: Wayback Machine URL<https://web.archive.org/web/20130627164235/https://www.sensoriafitness.com/>, retrieved on Oct. 8, 2021, retrieved from URL<https://www.sensoriafitness.com/>, 10 pages.

Tekscan.com [online], "F-Scan System," available on or before Feb. 2, 2016, via Internet Archive: Wayback Machine URL<https://web.archive.org/web/20160202032836/https://www.tekscan.com/products-solutions/systems/f-scan-system>, retrieved on Oct. 8, 2021, retrieved from URL<https://www.tekscan.com/products-solutions/systems/f-scan-system>, 5 pages.

Yoo et al., "Development of two-dimensional interdigitated center of pressure sensor," Smart Materials and Structures, Nov. 3, 2017, 26(12):125013, 14 pages.

* cited by examiner

PRESSURE-SENSITIVE MACHINE INTERFACE DEVICE

CROSS-REFERENCE TO RELATED APPLICATIONS

This application claims the benefit of U.S. Patent application Ser. No. 63/022,135, filed May 8, 2020, which is incorporated herein by reference.

TECHNICAL FIELD

This specification generally relates to enhanced electrical circuits.

BACKGROUND

There are many types of human machine interface (HMI) devices that exist today that enable people to interact with machines. Some of these devices are, for example, touchscreens, keyboards, and computer mice. Manufacturing a touchscreen typically involves layering a resistive or capacitive panel on top of a visual display.

SUMMARY

This specification generally describes pressure-sensitive HMI devices that include a pressure-sensitive conductive sheet embedded behind or in front of rigid, semi-rigid, and soft surfaces. These HMI devices can be placed within other components that have not traditionally been used for receiving machine inputs, such as within clothing, or within a wall of a building or other structure.

According to some implementations, a pressure-sensitive HMI device includes a surface element comprising an outer surface for receiving pressure inputs, multiple pressure-sensitive input regions that each include one or more positive electrodes and one or more return electrodes, and a pressure-sensitive conductive sheet disposed adjacent to or between the one or more positive electrodes and one or more return electrodes of the multiple pressure-sensitive input regions.

Implementations may include one or more of the following features. The pressure-sensitive conductive sheet may include a first side and a second side opposite to the first side, with the one or more positive electrodes being disposed adjacent to the first side of the pressure-sensitive conductive sheet, and the one or more return electrodes being disposed adjacent to the second side of the pressure-sensitive conductive sheet. The one or more positive electrodes and the one or more return electrodes may be disposed adjacent to a first side of the pressure-sensitive conductive sheet. The pressure-sensitive conductive sheet may include a polymeric foil impregnated with a conductive material. The pressure-sensitive conductive sheet may be a Velostat™ sheet. Each electrode may include a conductive trace arranged (e.g. printed) on a circuit board. A set of the pressure-sensitive input regions may be arranged in a straight line for detecting swipe inputs. A set of the pressure-sensitive input regions may be arranged to form a two-dimensional array. The outer surface for receiving pressure inputs may define a polygon, and a set of the pressure-sensitive input regions may be arranged along the edges of the polygon. The device may include a control circuit electrically connected to each pressure-sensitive input region, wherein the control circuit is configured to (i) detect user interactions with the outer surface based on electrical signals received from the pressure-sensitive input regions and (ii) operate one or more objects based on the detected user interactions. The control circuit is may be configured to detect gesture inputs from sequences of touch inputs detected based on electrical signals received from a sequence of pressure-sensitive input regions. The device may include a control circuit electrically connected to each pressure-sensitive input region, wherein the control circuit is configured to map a location of an object placed on the outer surface based on pressure-sensitive inputs detected at the pressure-sensitive input regions.

According to another implementation, a method for manufacturing a human-machine interface (HMI) device includes obtaining a surface element comprising an outer surface for receiving pressure inputs, forming multiple pressure-sensitive input regions that each include one or more positive electrodes and one or more return electrodes, and disposing a pressure-sensitive conductive sheet adjacent to or between the one or more positive electrodes and one or more return electrodes of the pressure-sensitive input regions.

Implementations may include one or more of the following features. The pressure-sensitive conductive sheet may include a first side and a second side opposite to the first side, and the method may include disposing the one or more positive electrodes adjacent to the first side of the pressure-sensitive conductive sheet, and disposing the one or more return electrodes adjacent to the second side of the pressure-sensitive conductive sheet. Forming multiple pressure-sensitive input regions may include forming the one or more positive electrodes and the one or more return electrodes on a common substrate, with the one or more positive electrodes and the one or more return electrodes being disposed adjacent to a first side of the pressure-sensitive conductive sheet. The method may include adhering the pressure-sensitive conductive sheet to the pressure-sensitive input regions. The method may include electrically connecting a control circuit to each pressure-sensitive input region. The method may include attaching the pressure-sensitive input regions to a wall associated with an indoor or outdoor structure, and electrically connecting the control circuit to an object associated with the structure. The method may include connecting the electrodes of the pressure-sensitive input regions to a flat flexible battery. The surface element for receiving pressure inputs may include a table top, and the method may include disposing the pressure-sensitive input regions, the pressure-sensitive conductive sheet, and the control circuit below the table top. The surface element for receiving pressure inputs may include a wall covering, and the method may include disposing the pressure-sensitive input regions, the pressure-sensitive conductive sheet, and the control circuit behind the wall covering.

According to another implementation, a method includes detecting, by a control circuit of a pressure-sensitive human-machine interface (HMI) device, a change in voltage across each of one or more pressure-sensitive input regions of a circuit board, wherein each pressure-sensitive input region comprises one or more positive electrodes and one or more return electrodes electrically connected to the control circuit; detecting, by the control circuit, at least one of (i) a user interaction with a surface of the pressure-sensitive HMI device or (ii) an object resting on the surface based on each change in voltage, wherein the pressure-sensitive HMI device comprises a pressure-sensitive conductive sheet disposed between the surface and the circuit board; and performing an action in response to detecting at least one of the user interaction or the object.

In some implementations, detecting the user interaction with the surface may include detecting a sequence of changes in voltage along a sequence of pressure-sensitive input regions.

The methods in accordance with the present disclosure can include any combination of the aspects and features described herein. That is, methods in accordance with the present disclosure are not limited to the combinations of aspects and features specifically described herein, but also may include any combination of the aspects and features provided.

The subject matter described in this specification can be implemented in particular embodiments so as to realize one or more of the following advantages. Using a pressure-sensitive conductive sheet with a circuit board having pressure-sensitive input regions enables the detection of pressure sensitive inputs along surfaces having various levels of rigidity and various levels of thickness. The pressure-sensitive conductive sheet also allows for larger pressure-sensitive input areas of a surface as compared to the use of pressure-sensitive resistors, which allows for the detection of gestures and/or objects using an array of pressure-sensitive input regions created using the pressure-sensitive conductive sheet and the circuit board. The circuit board can be formed using a thin substrate and printed conductive traces which, along with the pressure-sensitive conductive sheet, provides a thin pressure sensing element that can be placed under or behind various types of surfaces. The use of a pressure-sensitive conductive sheet also enables touch input detection along metallic surfaces where capacitive touch detection cannot be used. Thus, the pressure-sensitive HMI devices described in this document enable touch and pressure sensing under or behind surfaces where conventional sensors would not work properly.

The details of one or more implementations of the present disclosure are set forth in the accompanying drawings and the description below. Other features and advantages of the present disclosure will be apparent from the description and drawings, and from the claims.

DETAILED DESCRIPTION

Figure 1:
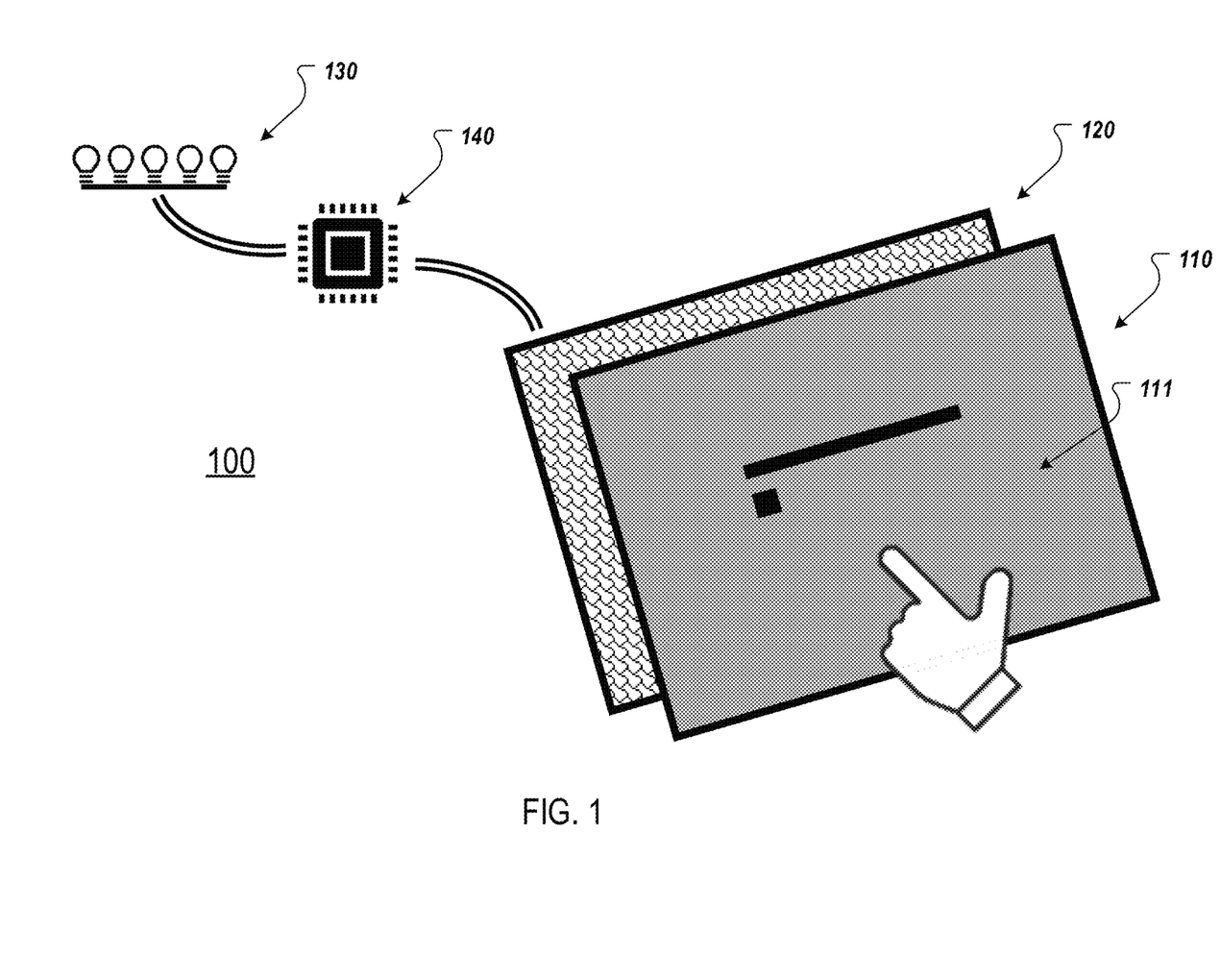
FIG. 1 depicts an example pressure-sensitive HMI device.

FIG. 1 depicts an example pressure-sensitive HMI device 100. Briefly, the pressure-sensitive HMI device 100 includes a surface element 110 and a printed circuit board (PCB) 120 embedded behind or under the surface element 110. A pressure-sensitive conductive sheet is placed between the surface element 110 and the PCB 120.

The surface element 110 can be a rigid, semi-rigid, or soft surface that is flexible enough such that, when pressure is applied to one side of the surface element 110 at a given location, the opposite side of the surface element 110 at the given location flexes against the PCB 120. For example, the surface element 110 can be a thin piece of a relatively rigid material, such as wood, metal, or plastic, or the surface element 110 can be soft material, such as cloth or paper (e.g., wallpaper). As shown in FIG. 1, inputs can take the form of touch inputs. In other implementations, the surface element 110 is arranged substantially horizontally, and inputs are provided by placing an object on top of the surface element 110. In such implementations, the weight of the object can cause the surface element 110 to flex at the object's location.

The surface element 110 includes an outer surface 111 for receiving a pressure input and an inner surface (not visible in FIG. 1) opposite the outer surface 111. Although the PCB 120 is described as being embedded behind or under the surface element 110, the PCB 120 can be more generally described as being disposed on the inner surface side of the surface element 110 independent of the actual orientation of the pressure-sensitive HMI device 100.

The surface element 110 may optionally indicate input locations, to allow a user to quickly identify an input region and provide inputs. For instance, if the surface element 110 is paper, an illustration on the paper may depict a shape that defines an input region, and may include the text "swipe here!"

The PCB 120 can include one or more pressure-sensitive input regions. Each input region can include a positive electrode and a return electrode (e.g., with a nest of alternating parallel positive and return electrodes) that are separated from each other on the PCB 120. The one or more positive electrodes are electrically connected to a positive voltage source, and one or more return electrodes may be electrically connected to a return path. For example, as described in more detail below, each input region can include a web or network of alternating positive electrodes and return electrodes.

A pressure-sensitive conductive sheet can be embedded between the surface element 110 and the PCB 120. When pressure is applied to the surface element 110 adjacent to an input region, the resistance of the pressure-sensitive conductive sheet between the positive and return electrode(s) of the input region decreases, resulting in a change in voltage (e.g. an increase in voltage) that can be detected on the return electrode. This change in voltage can be measured by a microprocessor and be used to determine that a touch or press occurred at that input region. In some implementations, a pull-down resistor can be incorporated between the return electrode and the microprocessor to increase the accuracy of the change in voltage detected by the microprocessor.

The pressure-sensitive conductive sheet can be in the form of a polymeric foil impregnated with or embedded with carbon, e.g., carbon black, or another conductive material that makes the pressure-sensitive sheet conductive. An example pressure-sensitive conductive sheet is a Velostat™ sheet, which is also referred to as Linqstat. The resistance of the pressure-sensitive sheet changes, e.g., decreases, when pressed. For example, the resistance of the pressure-sensitive conductive sheet can decrease with an increase in the amount of pressure applied to the pressure-sensitive conductive sheet.

When pressure is applied to the surface 110 above an input region, that point on the surface 110 presses the pressure sensitive conductive sheet against the input region on the PCB 120. The pressure-sensitive conductive sheet reduces the resistance between the positive electrode (s) and the return electrode(s) of the input region, causing a change in voltage across the input region, i.e., between the positive and return electrode(s).

The positive and return electrodes of each input region can be connected to a microprocessor 140 that controls another object based on user interaction with the surface element 110 above the input region. The microprocessor 140 is one example of a control circuit that can control another object based on pressure-sensitive inputs at the surface element 110. Other examples include microcontrollers, logic circuits, and computers. The microprocessor 140 can evaluate electrical signals emanating from the PCB 120, to discern various user interactions, detect various objects, or detect other types of pressure inputs. The microprocessor 140 can be configured to control other objects, such as industrial objects, audio, etc.

In one example, the microprocessor 140 can include a voltage detector for each input region that measures the change in voltage across the positive and return conductors of the input region. The microprocessor 140 can also include a processor or controller that controls a LED strip 130 based on user interaction with the input regions, i.e., based on the detected change in voltage. For example, the microprocessor 140 can be programmed or include software that operates the LED strip 130 based on the user interactions. In a particular example, the processor can be configured to increase the intensity of the LED strip 130 in response to detecting a change in voltage that is below a threshold for a particular input region assigned to increase the intensity of the LED strip 130.

The microprocessor 140 can also be configured to control the LED strip 130 or another object based on detected gestures or sequences of user interactions with the surface element 110. For example, the microprocessor 140 can monitor for a swipe in a particular direction across multiple input regions. If the microprocessor 140 detects a change in voltage below a threshold for the multiple input regions in a sequence that corresponds to the particular direction and within a specified time duration, the processor can determine that the swipe occurred and control the LED strip 130 accordingly.

The microprocessor 140 can also be configured to control the LED strip 130 or another object based on the magnitude of the change in voltage. The magnitude of the change in voltage varies with the amount of pressure placed on the surface 110 over the input regions as the resistance of the pressure-sensitive sheet varies with the amount of pressure. Thus, the user can provide different inputs to the microprocessor 140 by applying different amounts of pressure over an input region. The microprocessor 140 can detect the magnitude of the change in voltage across one or more of the pressure-sensitive input regions and perform an operation corresponding to the change in voltage. The various operations can be encoded as hardware and/or software instructions of the microprocessor 140.

Input regions do not need to be placed in the exact position where the user is expected to press on the surface element 110, in order for a touch to be detected. For example, if the surface element 110 is a very hard and rigid surface, input regions can be placed at the four corners of the HMI device 100. The microprocessor 140 can register where the touch is occurring based on the different pressure being applied to the four corners of the HMI device 100, and therefore the four changes in voltage are detected based on the input regions. For example, such a device 100 can be integrated into a tabletop or other horizontal surface and used to map the location of an object placed on the table. Similarly, some implementations can include an array of input regions that track the position and movement of an object (e.g., a mouse) across the tabletop.

The use of the pressure-sensitive conductive sheet within the HMI device 100 enables the manufacture of very thin (e.g., less than 5 millimeter (mm) thick) touch input HMI devices with a large surface input area. The thin thickness may be very advantageous for products that have limited space that cannot house bulkier electronics typically used for touch input. The input can be invisible to the user because the pressure sensors are hidden behind a rigid, semi-rigid, or soft surface. The pressure-sensitive inputs can be used to detect both individual presses and gesture or continuous inputs. The pressure-sensitive HMI devices can be used to control a variety of outputs, such as changing the color or intensity of lights, changing the volume of audio (e.g., of a TV, radio, computer, etc.), control of a motor (or other industrial device), changing the temperature setting of a thermostat, etc. Since the surface element protects the underlying sensors, the pressure-sensitive HMI devices 100 can be used in high-traffic conditions that are unsuited to conventional HMI devices, such as a building wall or a public space.

Figure 2:
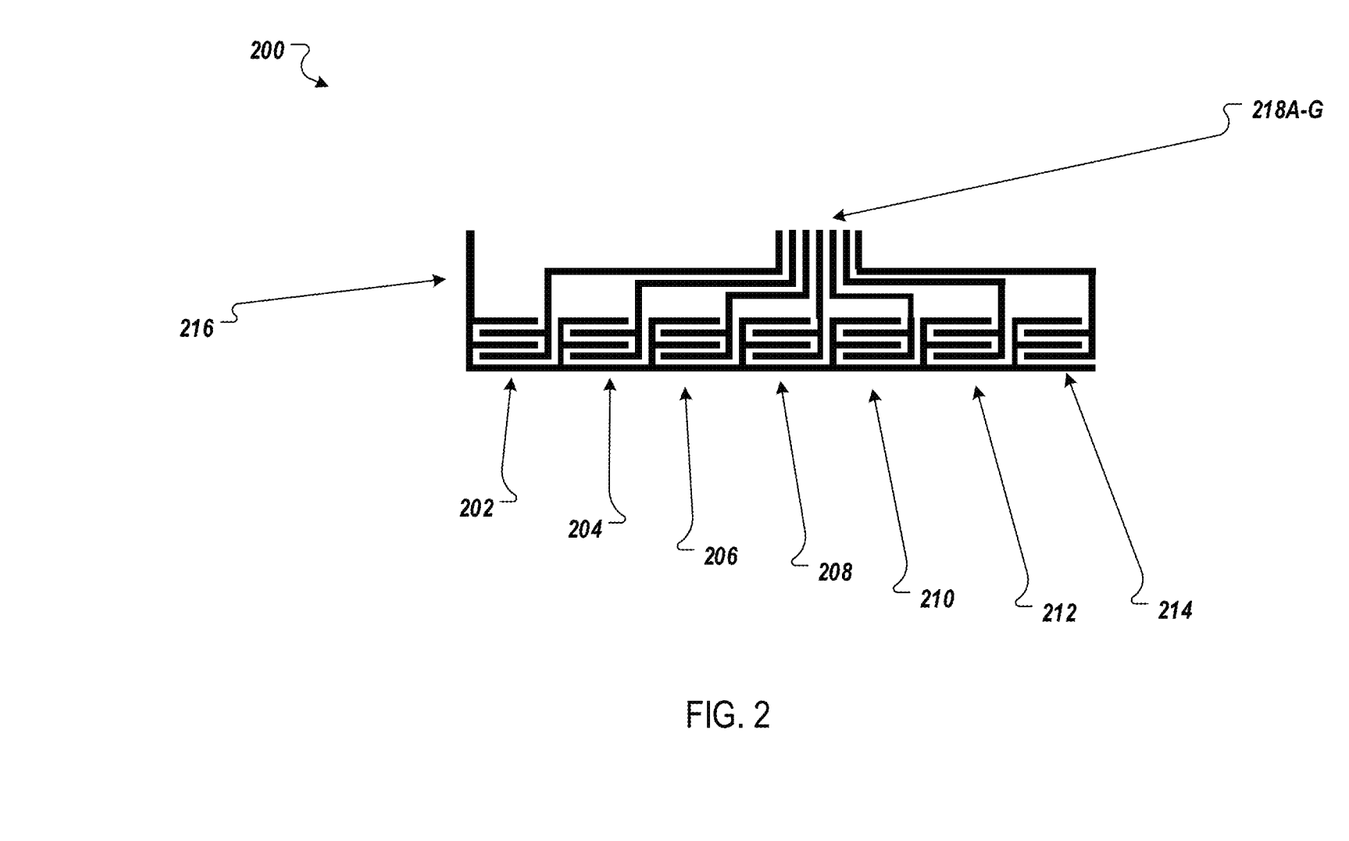
FIG. 2 is a diagram of an example circuit pattern that may be used in an HMI device

FIG. 2 is a diagram of an example circuit pattern 200 that may be used in an HMI device. The circuit pattern 200 may be deposited on a substrate. The circuit pattern 200 includes input regions 202-214. In this example, the circuit pattern 200 includes seven input regions that are aligned in straight line, but other quantities or alignments are possible. Each input region 202-214 includes a portion, e.g., branches, of a positive electrode 216, as well as a dedicated return electrode 218a-g that form a "webbed" input region design. One example of an alternative circuit design is depicted, e.g., in FIG. 4.

At each input region, the positive electrode 216 forms a gap with a respective one of the return electrodes 218a-g. The electrodes can be made of a conductive material, such as silver, copper, carbon-based inks, carbon nanotubes, graphene, conductive polymers, e.g., PEDOT:PSS (Poly(3, 4-ethylenedioxythiophene polystyrene sulfonate)), or titanium carbide. The electrodes can be in the form of conductive traces printed on the substrate (e.g., using inkjet printing). In some cases, the electrodes can be laser cut from a conductive sheet. The combination of the substrate and the electrodes can form a PCB, such as the PCB 120 of FIG. 1.

When a person interacts with, or an object is placed on, a surface element adjacent to, e.g., above, an input region, the pressure-sensitive conductive sheet (e.g., Velostat™) is pushed at an area adjacent to the gap between the positive electrode and a return electrode, thereby providing an electrical path between the adjacent electrodes. The harder the surface is pressed, the less resistance there is between adjacent electrodes due the characteristics of the pressure-sensitive conductive sheet, resulting in different voltages between the positive electrode and the return electrode, based on an amount of pressure that is applied to the surface element.

A circuit for controlling an object can include a voltage sensor for each input region 202-214. The voltage sensor for an input region can be connected between the source positive conductor (or the positive lead of a source power supply connected to the source positive conductor) and the respective source return conductor for the input region. In this way, the voltage sensor can detect the change in voltage for the input region and/or monitor for changes in voltage across the electrodes for the input region. In some implementations, the circuit can include a current sensor in place of the voltage sensor for each input as the changes in voltage result in different amounts of current.

Based on the amount of current (or change in voltage) that is detected, the HMI device can control other objects, such as a LED strip. The various electrodes can be connected to a microprocessor or other control circuit using a wiring harness or other mechanism. For example, the connections can be made using a flat flexible battery connected through conductive traces that fit in a particular area, e.g., in a corner of the HMI, making the HMI self-sustaining and portable.

The arrangement of the input regions 202-214 in a straight line allows for the HMI device to be used for the detection of swipe gestures across a surface above or below a PCB. For example, if a person performs a rightward swipe, but swiping the surface from a point above the input region 202 to a point above the input region 214 with some pressure against the surface, the control circuit connected to the input regions 202 to 214 can detect the change in voltage in sequence from the input region 202 to the input region 214, and control an object in response to detecting the sequence. For example, the circuit can detect an increase in the voltage across the electrodes for input region 202, then an increase in the voltage across the electrodes for input region 204, and so on. The control circuit can be configured to monitor for particular sequences of changes in voltage that each correspond to a particular gesture. When a particular sequence is detected, the circuit can perform the operation corresponding to the detected sequence. Each sequence can include a proper subset of the input regions, and some sequences can include all of the input regions, depending on the gesture or object to be detected. For example, a short swipe from input region 206 to input region 202 can correspond to a first operation, e.g., increasing the intensity of a LED, and a longer swipe from input region 202 to input region 214 can correspond to a second operation, e.g., turning off the LED.

Although some implementations are based on detecting a sequence of voltage changes, other implementations can detect simultaneous voltage changes in a plurality of input regions 202 to 214. For example, a multi-touch event may be detected when a user presses two input regions 202 and 214 simultaneously. The multi-touch event may include more than two input regions. The input regions may be located adjacent to one another in the circuit pattern, or the input regions may be spaced apart from one another. Multi-touch gestures, e.g., swipes, can be detected by detecting sequences of voltage changes along two or more different paths across input regions.

Although FIG. 2 depicts input regions 202-214 arranged in a single straight line, other implementations can include a line of input regions having a different shape (e.g. curved, wavy, or zigzag). Implementations can include multiple lines each having multiple input regions, or even a grid or two-dimensional array of input regions. Each dimension of an array can include two or more input regions. In general, the number of input regions and the size of each input region determines the resolution of the circuit pattern. A circuit that has a greater number of small input regions has a higher resolution and is able to accurately detect complex input movements. Conversely, a simple circuit with fewer, larger input regions is suited to a narrower range of input movements.

Figure 3:
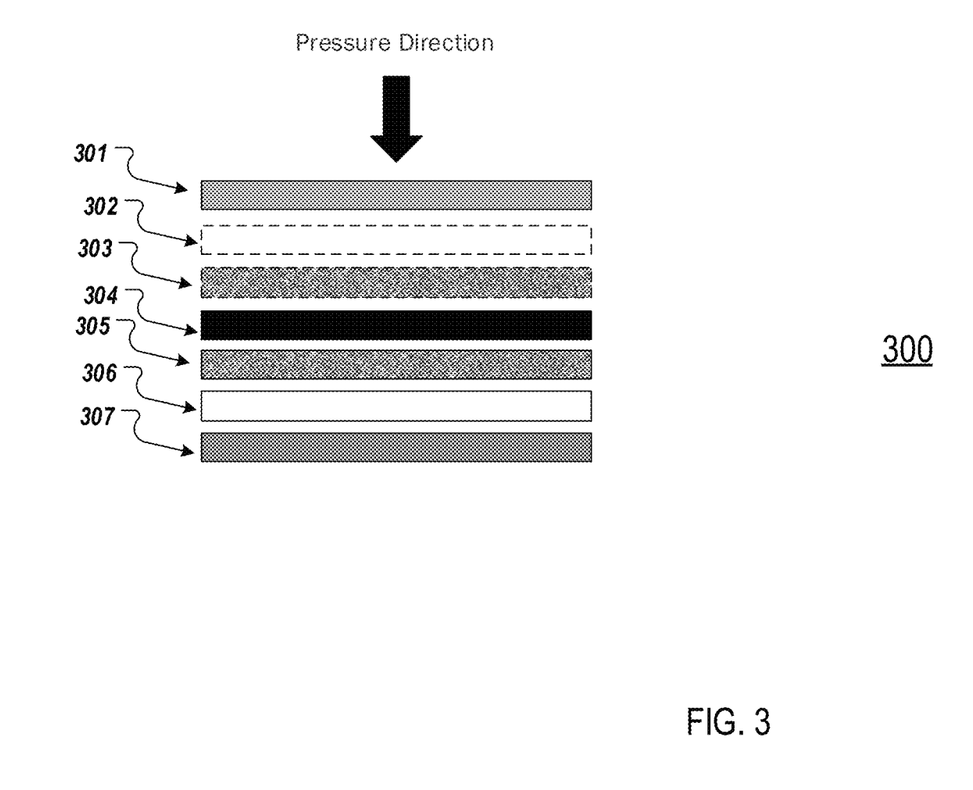
FIG. 3 depicts the layers of an example pressure-sensitive HMI device.

FIG. 3 depicts layers of an example pressure-sensitive HMI device 300, as well as a process for manufacturing the HMI device 300. In the illustrated example, the pressure-sensitive HMI device 300 includes a rigid, semi-rigid, or soft surface element 301, disposed above an optional top substrate 302 and an optional top conductive layer 303, as shown by the dashed lines. A pressure-sensitive conductive sheet 304 is disposed beneath the surface element 301 (and the optional top substrate 302 and/or optional top conductive layer 303). A bottom conductive layer 305, e.g., conductive ink, is disposed on a bottom substrate 306, for each input region, e.g., through a printing process. The bottom substrate 306 is disposed on a rigid, semi-rigid, or a soft backing 307. In some implementations, there is an air gap between each conductive layer 303 and 305 and the pressure-sensitive sheet 304 when in a default state, e.g., when no pressure is being applied to the surface element 301.

As described, some implementations of the HMI device 300 can omit the top substrate 302 and the top conductive layer 303. In such cases, the HMI device 300 includes the surface element 301, the pressure-sensitive conductive sheet 304, the conductive layer 305, the substrate 306, and the backing 307. For example, the conductive layer 305 and the substrate 306 can implement the webbed circuit design depicted in FIG. 2. Since such an implementation includes a circuit on only one layer, manufacturing costs and the overall thickness of the HMI device 300 may be reduced.

As described below in reference to FIG. 4, other implementations of the HMI device 300 include the surface element 301, the top conductive layer 303, the pressure-sensitive conductive sheet 304, the bottom conductive layer 305, and the backing 307. In some implementations, omitting the substrate 302, 306 may further reduce the thickness of the HMI device 300.

The surface element 301 includes an outer surface of the HMI device 300 that can face the user and that receives pressure-based input, similarly to the surface element 110 depicted in FIG. 1. The surface element 301 also includes an inner surface that faces the top substrate 302, if included, or the pressure-sensitive conductive sheet 304 if the top substrate 302 is not included. As described, the surface element 301 can include a rigid, semi-rigid, or a soft material. The material of the surface element 301 can deform or be depressed in response to pressure applied to the surface element 301 (e.g., touch input). In some implementations, the extent of the deformation is tailored to the resolution or granularity of the HMI device 300. For example, a surface element 301 that covers layers configured to detect touch inputs in high resolution can include a relatively soft material that deforms locally in response to the user's touch input. Alternatively, a surface element 301 configured to detect lower-resolution touch inputs may have a more rigid material with less give, e.g., to impart robustness to the device.

In addition to the material of the surface element 301, the deformation characteristics can also be determined by the thickness of the surface element 301. For example, the surface element 301 can be made of a thin sheet of metal (e.g., having a thickness of 0.05 to 1 mm) that is both robust and responsive to pressure. If the surface element 301 is made of a material that is softer or less rigid than metal, the surface element 301 may have a greater thickness, e.g., from about 0.05 to 50 mm. In yet another implementation, the surface element 301 can be formed by a coat of paint having a thickness, e.g., of about 1 to 50 microns. Thus, the HMI device 300 is flexible and can be used with many difference surface elements 301 having different materials or different levels of rigidity due to the combination of the pressure-sensitive conductive sheet 304 and circuits formed from the conductive materials.

In some implementations, the HMI device 300 includes a top substrate 302 and a top conductive layer 303 that are arranged below the surface element 301. Similarly to the bottom conductive layer 305, the top conductive layer 303 can include a conductive ink printed on the top substrate 302, e.g., paper, plastic, or polyethylene terephthalate (PET). If provided, both the top and the bottom conductive layers are arranged to come into contact with the pressure-sensitive conductive sheet 304, so that the deformation of the pressure-sensitive conductive sheet 304 can influence the electrical path between the elements printed on each conductive layer 303, 305.

Figure 4:
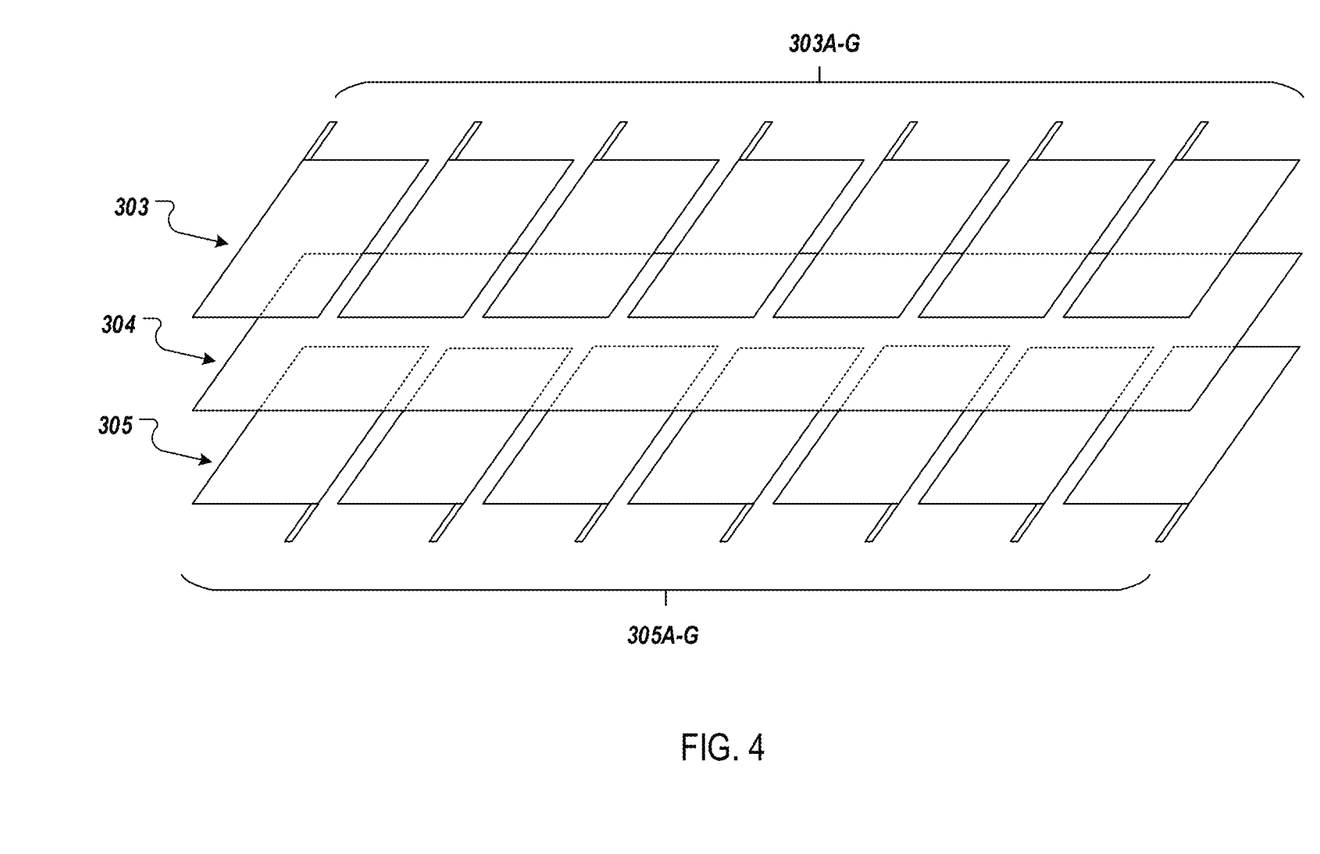
FIG. 4 is an isometric exploded view of a further example circuit pattern that may be used in an HMI device.

As depicted in FIG. 4, in some implementations in which the top substrate 302 is included, the top conductive layer 303 can include, for each input region, one or more positive electrodes 303A-G that are electrically connected to a positive voltage source (not shown). Similarly, the bottom conductive layer 305 can include, for each input region, one or more return electrodes 305A-G electrically connected to a return path (not shown). In other examples, the positive electrodes can be part of the bottom conductive layer 305 and the return electrodes can be part of the top conductive layer 303. The one or more positive electrodes for each input region can be disposed in a location on the top substrate 302 corresponding to the location of the one or more return electrodes for the input region disposed on the bottom substrate 306. For example, the positive electrode(s) for an input region can be disposed directly above the return electrode(s). In this way, when a person or object presses against the surface element 301, the portion of the pressure-sensitive conductive sheet 304 disposed between the positive electrode(s) and the negative electrode(s) flatten, thereby reducing the resistance between the positive and negative electrodes and reducing the voltage across the electrodes. In some cases, reading a change in resistance through the pressure-sensitive conductive sheet 304 rather than on one side can more accurately detect the force being applied to a sensing region. For example, such increase sensitivity can allow the HMI device 300 to be used similarly to a scale.

As shown in FIG. 4, the electrodes 303A-G, 305A-G can include solid infill regions. Such infill regions can be implemented without the resolution required for the webbed circuit design depicted in FIG. 2. Thus the electrodes 303A-G, 305A-G can be cut from a conductive sheet (e.g., of aluminum or copper) using scissors, a digital plotter, or a laser cutter, and attached to the surface element 301 and backing 307 (not shown in FIG. 4) without an intermediate substrate 302, 306. Alternatively, the electrodes can be in the form of the input regions shown in FIG. 2, or in another appropriate arrangement. For example, the webbed circuit design depicted in FIG. 2 may have greater accuracy at registering pressure input in a specific input region in comparison to solid electrodes. Thus, the webbed circuit design can be used in implementations in which higher resolution touch detection is desired and the multi-layer electrode design of FIG. 4 can be used when lower resolution touch detection is sufficient.

Although FIG. 3 schematically depicts the top conductive layer 303 stacked above the bottom conductive layer 305, the patterns provided on the respective layers 303, 305 may not fully overlap in some cases. For example, the top conductive layer 303 may be printed with a circuit pattern that includes a plurality of input regions similar to those depicted in FIG. 2. The bottom conductive layer 305 may also be printed with a circuit pattern that includes a plurality of input regions formed in mirror image to the input regions printed on the top conductive layer 303. The input regions of the top and bottom conductive layers 303, 305 may be arranged so that the input regions of the top conductive layer 303 are staggered in comparison to the input regions of the bottom conductive layer 305. Thus, the top and bottom conductive layers 303, 305 can be used to implement an intricate circuit pattern that reduces the gaps between input regions and more accurately sense touch inputs.

In some implementations, the pressure-sensitive conductive sheet 304 includes a Velostat™ sheet with an electrical resistance that changes in response to pressure. In other implementations, another polymeric foil impregnated with a conductive material can be used as the pressure-sensitive conductive sheet 304. Although FIG. 3 depicts the pressure-sensitive conductive sheet 304 as having the same size as the other layers of the HMI device 300, this may not necessarily be the case. For example, the material forming the pressure-sensitive conductive sheet 304 can be cut to size to overlap selected portions of the conductive layers 303, 305 (e.g., only the input regions).

The backing 307 can include a rigid, semi-rigid, or soft material depending on the application. In some implementations, the backing 307 can include a semi-rigid or soft material that is later attached to another surface or structure (not shown). In this case, the semi-rigid or soft material may contribute to a low overall profile of the device 300. In other implementations, the backing 307 may be integral with a larger structure, such as a desk or a building wall. Generally speaking, the purpose of the backing 307 is to support the remaining layers of the device 300 and to facilitate integration of the device 300 into the end structure. If the backing 307 is part of the end structure, the backing 307 may also be designed to resist the deformation of the remaining layers in response to the user's touch input.

Manufacturing the HMI device 300 includes adding each illustrated layer over one another, until the desired HMI device 300 is complete. As described, the pressure-sensitive conductive sheet 304 may or may not cover the entire surface of the HMI device 300, depending on the desired implementation. Light pressure and/or heat that is applied over the surface element 301 for a short amount of time during the manufacturing process may adhere the pressure-sensitive conductive sheet 304 to the adjacent layer. Light pressure may also be applied to the surface element 301 to adhere the surface element 301 to lower layers. In some cases, an additional adhesive layer (not shown) may be provided between the respective layers. In some implementations, the surface element 301 and the backing 307 may be part of a separate structure. In such cases, the remaining layers of device 300 can be pre-assembled and integrated into the final structure, e.g., using additional adhesive layers.

Figure 5:
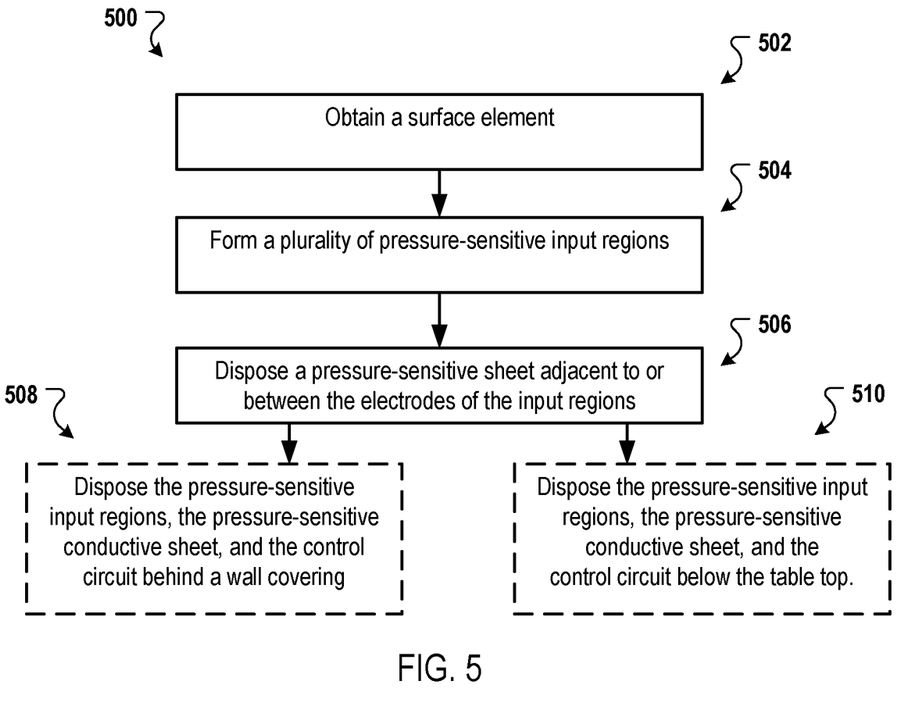
FIG. 5 is a flow chart of an example process for manufacturing an HMI device.

FIG. 5 is a flow chart of an example process 500 for manufacturing an HMI device. The process 500 can be used to manufacture any of the HMI devices described above. The process 500 can be performed by automated manufacturing equipment.

A surface element is obtained (502). The surface element can include an outer surface for receiving pressure inputs, e.g., inputs from a person or object, and an inner surface. The surface element be a rigid, semi-rigid, or soft surface. For example, the surface element can be a table top, wallpaper, a metal sheet, clothing, a mousepad, etc.

A plurality of pressure-sensitive input regions is formed (504). Each pressure-sensitive input region can include one or more positive electrodes and one or more return electrodes. The input regions can be manufactured, e.g., as part of this process, by printing or otherwise disposing conductive material on a substrate. The conductive material can be arranged to form the input regions, e.g., as shown in FIG. 2.

A pressure-sensitive sheet is disposed adjacent to or between the one or more positive electrodes and one or more return electrodes of the plurality of pressure-sensitive input regions (506). The pressure-sensitive sheet can be a polymeric foil impregnated with a conductive material. In some implementations, the pressure-sensitive sheet includes Velostat™. In some implementations, the pressure-sensitive conductive sheet includes a first side and a second side opposite to the first side, and the process 500 includes disposing the one or more positive electrodes adjacent to the first side of the pressure-sensitive conductive sheet and disposing the one or more return electrodes adjacent to the second side of the pressure-sensitive conductive sheet. Such an implementation may result in the arrangement depicted in FIG. 4. In other cases, forming a plurality of pressure-sensitive input regions can include forming the one or more positive electrodes and the one or more return electrodes on a common substrate (e.g. similarly to FIG. 2), with the one or more positive electrodes and the one or more return electrodes being disposed adjacent to a first side of the pressure-sensitive conductive sheet.

The process 500 can also include electrically connecting a control circuit to each pressure-sensitive input region. For example, each positive electrode of the input regions can be electrically connected to a positive electrode of the control circuit and each return electrode can be electrically connected to a return electrode of the control circuit. In this way, the control circuit can detect the change in voltage across each input region. In some cases, the process 500 can include connecting the electrodes of the pressure-sensitive input regions to a flat flexible battery.

The process 500 can also include adhering the pressure-sensitive conductive sheet to the pressure-sensitive input regions. In some cases, this may improve the interaction between the electrodes of the input regions and the pressure-sensitive conductive sheet.

In some cases, the HMI device is integrated into a further structure. For example, the process 500 can also include attaching the pressure-sensitive input regions to a wall associated with an indoor or outdoor structure and electrically connecting the control circuit to an object associated with the structure. For example, the surface element for receiving pressure inputs can comprise a wall covering, and the process 500 can comprise disposing the pressure-sensitive input regions, the pressure-sensitive conductive sheet, and the control circuit behind the wall covering (508). In this way, the process 500 provides an HMI device that is integrated into an internal or external wall of a building or public space and can even be hidden from view (e.g., behind a wall covering). In some cases, the HMI device can be integrated into the surface of an object, e.g., a piece of furniture. For example, the HMI device may be integrated into the side of a couch.

The HMI device can also be integrated into other structures. For example, the surface element for receiving pressure inputs can comprise a table top, and the process 500 can include disposing the pressure-sensitive input regions, the pressure-sensitive conductive sheet, and the control circuit below the table top (510). Depending on the choice of material of the table top, such a process can be used to integrate a HMI device for touch input or for object detection into a table or piece of similar furniture. Although this embodiment is described in conjunction with a table, the general concept is applicable to all structures or pieces of furniture that present a surface, e.g., a substantially horizontal surface, on which an object can be placed.

Figure 6:
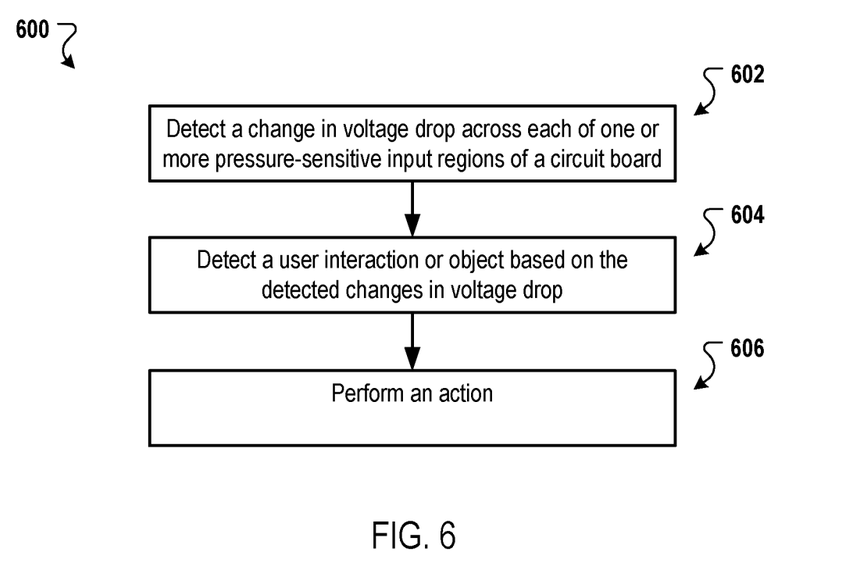
FIG. 6 is a flow chart of an example process for detecting user interaction with a surface of an HMI device.

FIG. 6 is a flow chart of an example process 600 for detecting user interaction with a surface of an HMI device. The process 600 can be performed by a control circuit of an HMI device, such as the microprocessor 140 of the HMI device 100 of FIG. 1.

The control circuit detects a change in voltage across each of one or more pressure-sensitive input regions of a circuit board (602). For example, the control circuit can monitor the voltage across each input region using a voltage sensor. The control circuit can also compare a detected change in voltage to previous voltage changes and/or to threshold voltage changes to determine whether to perform an action, e.g., to control an object. Detecting a change in voltage can include detecting a change in voltage that is greater than, or less than, a particular threshold.

The control circuit detects at least one of (i) a user interaction with a surface of the pressure-sensitive HMI device or (ii) an object resting on the surface based on each change in voltage (604). A user interaction can correspond to a touch occurring at one or more input regions. For example, a "press" user interaction can correspond to pressing the surface of the HMI device at a particular location corresponding to a particular input region. If the control circuit detects that the change in voltage across the particular input region dropped to or below a threshold, the control circuit can determine that the press occurred.

A particular gesture can correspond to swiping the surface in a particular sequence across the surface above multiple input regions. If the control circuit detects a change in voltage across the multiple input regions in an order defined by the particular sequence, the control circuit can determine that the gesture occurred.

A particular object can correspond to a particular amount of pressure being applied to the surface above a particular subset of the input regions. The control circuit can detect that the particular object is placed on the surface by detecting, for each input region in the subset of input regions, a voltage change that corresponds to the amount of pressure that the object would place above that input region. In this example, the control circuit can include, for each object to be detected, data indicating the voltage changes or ranges of voltage changes for each input region.

The control circuit performs an action in response to detecting the user interaction or object (606). For example, the control circuit can control an LED based on a detected press or gesture. In another example, the control circuit can record data identifying the detected object and a time at which the object was detected. The control circuit can also control another object based on the detected object.

Embodiments of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine generated electrical, optical, or electromagnetic signal, that is generated to encode information for transmission to suitable receiver apparatus for execution by a data processing apparatus. The computer storage medium can be a machine readable storage device, a machine readable storage substrate, a random or serial access memory device, or a combination of one or more of them. The computer storage medium is not, however, a propagated signal.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) monitor, an LCD (liquid crystal display) monitor, or an OLED display, for displaying information to the user, as well as input devices for providing input to the computer, e.g., a keyboard, a mouse, or a presence sensitive display or other surface. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A pressure-sensitive human-machine interface (HMI) device comprising:
    a surface element comprising an outer surface for receiving pressure inputs, and an inner surface;
    a plurality of pressure-sensitive input regions that each include one or more positive electrodes electrically connected to a positive voltage source, and one or more return electrodes electrically connected to a return path, the one or more positive electrodes and the one or more return electrodes being formed on a common substrate;
    a pressure-sensitive conductive sheet comprising:
       (i) a first side in contact with the common substrate and with both the one or more positive electrodes and the one or more return electrodes of the plurality of pressure-sensitive input regions when no pressure is being applied to the outer surface of the surface element and when pressure is being applied to the outer surface of the surface element, and
       (ii) a second side that is opposite to the first side, the second side being in contact with the inner surface of the surface element and deforming when pressure is being applied to the outer surface of the surface element,
       wherein the pressure-sensitive conductive sheet conducts electricity between one or more of the positive electrodes and one or more of the return electrodes of the pressure-sensitive regions when no pressure is being applied to the outer surface of the surface element and when pressure is being applied to the outer surface of surface element, and exhibits a variable resistance that varies with an amount of the pressure that is being applied to the outer surface of the surface element; and
    a control circuit electrically connected to each pressure-sensitive input region, wherein the control circuit is configured to (i) detect a change in voltage above a threshold of the electricity conducted between the one or more of the positive electrodes and the one or more of the return electrodes of the pressure-sensitive input regions and (ii) operate one or more objects based on detecting the change in voltage above the threshold.

2. The pressure-sensitive HMI device of claim 1, wherein the pressure-sensitive conductive sheet comprises a polymeric foil impregnated with a conductive material.

3. The pressure-sensitive HMI device of claim 1, wherein the pressure-sensitive conductive sheet comprises Velostat.

4. The pressure-sensitive HMI device of claim 1, wherein each electrode comprises a conductive trace arranged on a circuit board.

5. The pressure-sensitive HMI device of claim 1, wherein a set of the plurality of pressure-sensitive input regions are arranged in a straight line for detecting swipe inputs.

6. The pressure-sensitive HMI device of claim 1, wherein a set of the plurality of pressure-sensitive input regions are arranged to form a two-dimensional array.

7. The pressure-sensitive HMI device of claim 1, wherein the outer surface for receiving pressure inputs defines a polygon, and a set of the plurality of pressure-sensitive input regions are arranged along the edges of the polygon.

8. The pressure-sensitive HMI device of claim 1, wherein the control circuit is configured to map a location of an object placed on the outer surface based on pressure-sensitive inputs detected at the pressure-sensitive input regions.

9. A method for manufacturing a human-machine interface (HMI) device comprising:
    obtaining a surface element comprising an outer surface for receiving pressure inputs and an inner surface;
    forming a plurality of pressure-sensitive input regions that each include one or more positive electrodes electrically connected to a positive voltage source and one or more return electrodes electrically connected to a return path, the one or more positive electrodes and the one or more return electrodes being formed on a common substrate; and
    forming a pressure-sensitive conductive sheet in contact with the common substrate and with both the one or more positive electrodes and the one or more return electrodes of the plurality of pressure-sensitive input regions, wherein the pressure-sensitive conductive sheet comprises:
       (i) a first side in contact with the common, substrate and with both the one or more positive, electrodes and the one or more return electrodes of the pressure-sensitive input regions when no pressure is being applied to the outer surface of the surface element and when pressure is being applied to the outer surface of the surface element, and
       (ii) a second side that is opposite to the first side, the second side being in contact with the inner surface of the surface element and deforming when pressure is being applied to the outer surface of the surface element,
       wherein the pressure-sensitive conductive sheet conducts electricity between one or more of the positive electrodes and one or more of the return electrodes of the pressure-sensitive regions when no pressure is being applied to the outer surface of the surface element and when pressure is being applied to the outer surface of the surface element, and exhibits a variable resistance that varies with an amount of the pressure that is being applied to the outer surface of the surface element; and
    electrically connecting a control circuit to each pressure-sensitive input region, wherein the control circuit is configured to (i) detect a change in voltage above a threshold of the electricity conducted between the one or more of the positive electrodes and the one or more of the return electrodes of the pressure-sensitive input regions and (ii) operate one or more objects based on detecting the change in the voltage above the threshold.

10. The method of claim 9, wherein forming the plurality of pressure-sensitive input regions comprises forming the one or more positive electrodes and the one or more return electrodes on the common substrate, with the one or more positive electrodes and the one or more return electrodes being disposed adjacent to the first side of the pressure-sensitive conductive sheet.

11. The method of claim 9, further comprising:
adhering the pressure-sensitive conductive sheet to the pressure-sensitive input regions.

12. The method of claim 9, further comprising:
attaching the pressure-sensitive input regions to a wall associated with an indoor or outdoor structure; and
electrically connecting the control circuit to an object associated with the structure.

13. The method of claim 9, further comprising:
connecting the electrodes of the pressure-sensitive input regions to a flat flexible battery.

14. The method of claim 9, wherein the surface element for receiving pressure inputs comprises a table top, the method further comprising:
disposing the pressure-sensitive input regions, the pressure-sensitive conductive sheet, and the control circuit below the table top.

15. The method of claim 12, wherein the surface element for receiving pressure inputs comprises a wall covering, the method further comprising:
disposing the pressure-sensitive input regions, the pressure-sensitive conductive sheet, and the control circuit behind the wall covering.

16. A computer-implemented method comprising:
detecting, by a control circuit, a change in voltage above a threshold of electricity conducted between one or more positive electrodes and one or more return electrodes of pressure-sensitive regions; and
operating, by the control circuit, one or more objects based on detecting the change in the voltage above a threshold, wherein:
the one or more positive electrodes and the one or more return electrodes are formed on a common substrate,
a first side of a pressure-sensitive conductive sheet is in contact with the common substrate and with both the one or more positive electrodes and the one or more return electrodes when no pressure is being applied to an outer surface of a surface element and when pressure is being applied to an outer surface of the surface element,
a second side of the of the pressure-sensitive conductive sheet that is opposite to the first side, the second side being in contact with an inner surface of the surface element and deforming when pressure is being applied to the outer surface of the surface element,
the pressure-sensitive conductive sheet conducts electricity between one or more of the positive electrodes and one or more of the return electrodes when no pressure is being applied to the outer surface of the surface element and when pressure is being applied to the outer surface of the surface element, and exhibits a variable resistance that varies with an amount of the pressure that is being applied to the outer surface of the surface element.

* * * * *

UNITED STATES PATENT AND TRADEMARK OFFICE
CERTIFICATE OF CORRECTION

PATENT NO. : 11,907,463 B2
APPLICATION NO. : 17/211267
DATED : February 20, 2024
INVENTOR(S) : Mark Benjamin Greenspan and Lavinia Andreea Danielescu Page 1 of 1

It is certified that error appears in the above-identified patent and that said Letters Patent is hereby corrected as shown below:

On the Title Page

Column 2 Item (56) (Other Publications), Line 1, delete "Crestoron" and insert -- Crestron --.

In the Claims

In Claim 9, Column 16, Line 44, delete "common," and insert -- common --.

In Claim 9, Column 16, Line 45, delete "positive," and insert -- positive --.

In Claim 16, Column 18, Line 29, before "pressure" delete "of the".

Signed and Sealed this
Second Day of April, 2024

Katherine Kelly Vidal
*Director of the United States Patent and Trademark Office*